(12) United States Patent
Kajiyama

(10) Patent No.: US 8,238,144 B2
(45) Date of Patent: Aug. 7, 2012

(54) MAGNETIC MEMORY

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 12/716,723

(22) Filed: Mar. 3, 2010

(65) Prior Publication Data

US 2010/0226167 A1  Sep. 9, 2010

(30) Foreign Application Priority Data

Mar. 3, 2009 (JP) ................... 2009-049366

(51) Int. Cl.
*G11C 11/00* (2006.01)

(52) U.S. Cl. ............. 365/158; 365/185.13; 365/185.26; 365/189.11

(58) Field of Classification Search .................. 365/158, 365/185.13, 185.26, 189.11
See application file for complete search history.

(56) References Cited

U.S. PATENT DOCUMENTS

| | | | |
|---|---|---|---|
| 6,351,409 B1 | 2/2002 | Rizzo et al. | |
| 6,754,100 B1 * | 6/2004 | Hayakawa | 365/173 |
| 7,230,844 B2 * | 6/2007 | Deak | 365/171 |
| 7,382,643 B2 * | 6/2008 | Ashida et al. | 365/158 |
| 7,742,328 B2 * | 6/2010 | Chen et al. | 365/158 |
| 2003/0214834 A1 | 11/2003 | Nagashima | |
| 2009/0166773 A1 * | 7/2009 | Ohno et al. | 257/421 |
| 2010/0193888 A1 * | 8/2010 | Gu et al. | 257/421 |

OTHER PUBLICATIONS

Y. Nozaki et al., "Numerical study on microwave-assisted magnetization reversal of magnetic particles several tens of nanometers wide with perpendicular anisotropy," Journal of Applied Physics 105, 07B901, 2009.

Y. Nozaki et al., "Influence of interlayer magnetostatic coupling on the ferromagnetic resonance properties of lithographically patterned ferromagnetic trilayers," Applied Physics Letters 92, 161903, 2008.

* cited by examiner

*Primary Examiner* — Pho M Luu

(74) *Attorney, Agent, or Firm* — Knobbe, Martens, Olson & Bear, LLP

(57) ABSTRACT

A spin-transfer magnetic memory includes a magnetoresistive element having a pinned layer, a free layer and a tunnel insulating layer provided between the pinned layer and the free layer, a bit line connected to one terminal of the magnetoresistive element, a select transistor having a current path whose one terminal is connected to the other terminal of the magnetoresistive element, a source line connected to the other terminal of the current path of the select transistor, and a pulse generation circuit passing a microwave pulse current through the magnetoresistive element, and assisting a magnetization switching of the free layer in a write operation.

18 Claims, 20 Drawing Sheets

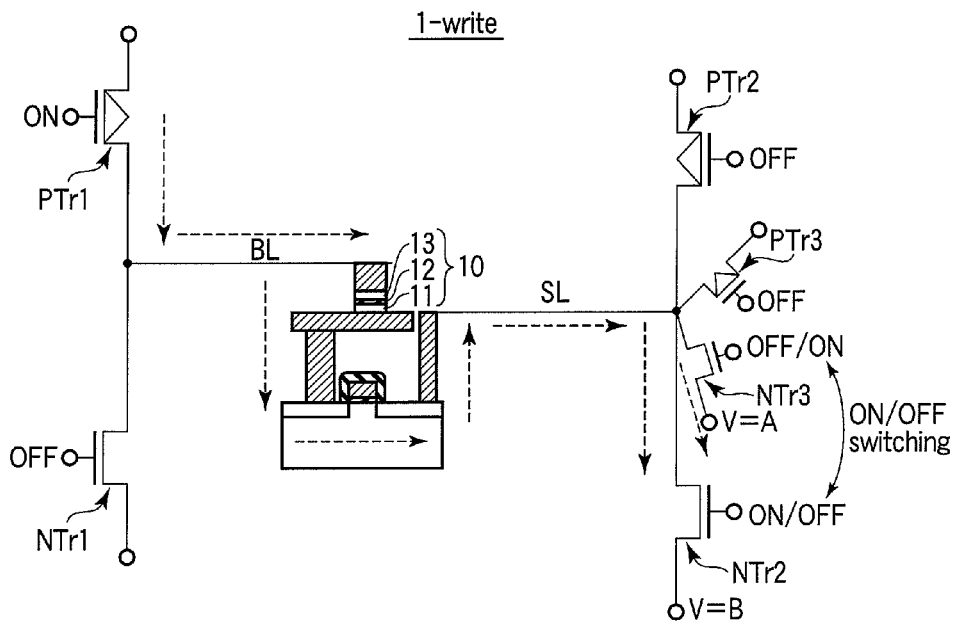
F I G. 7
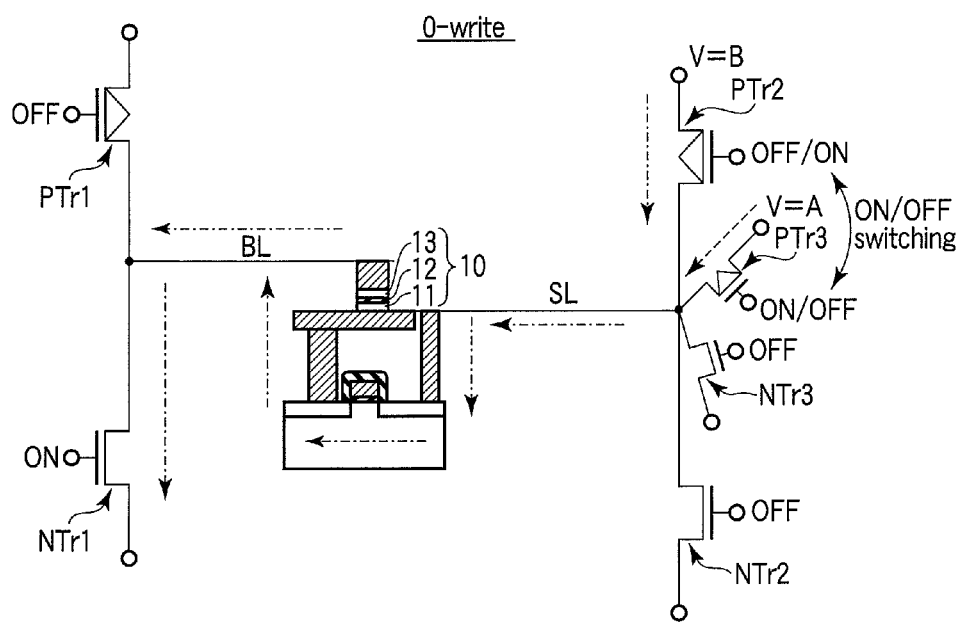
F I G. 8

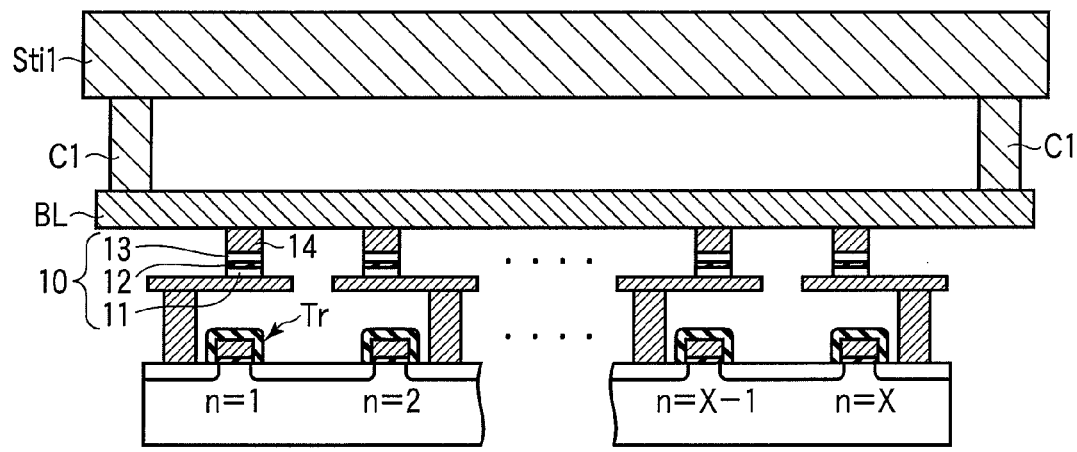
F I G. 11
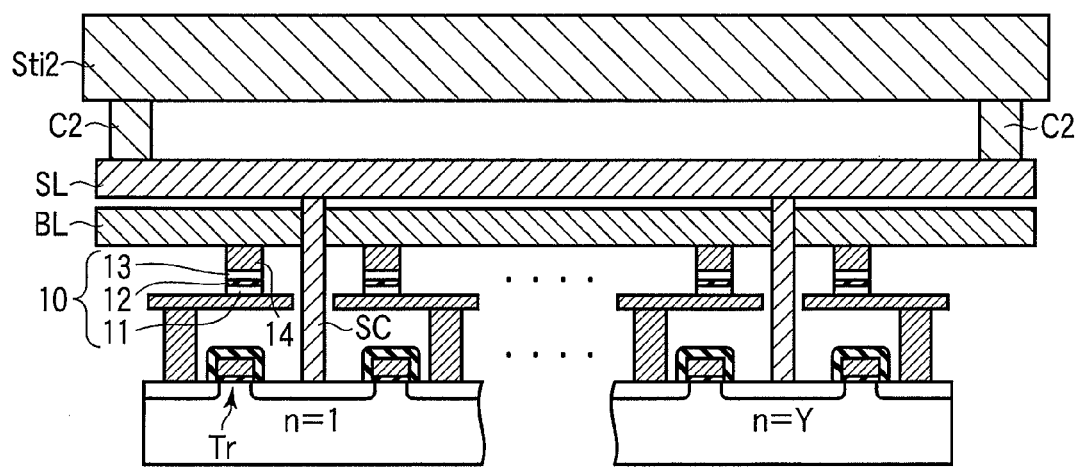
F I G. 12

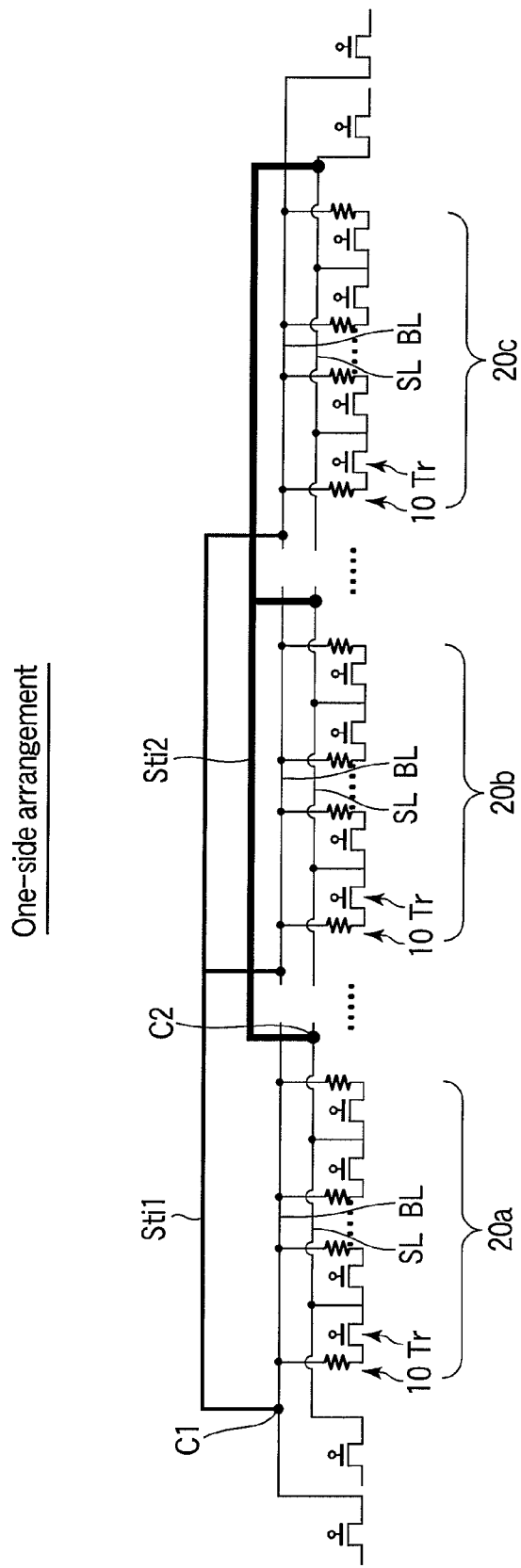
F I G. 14

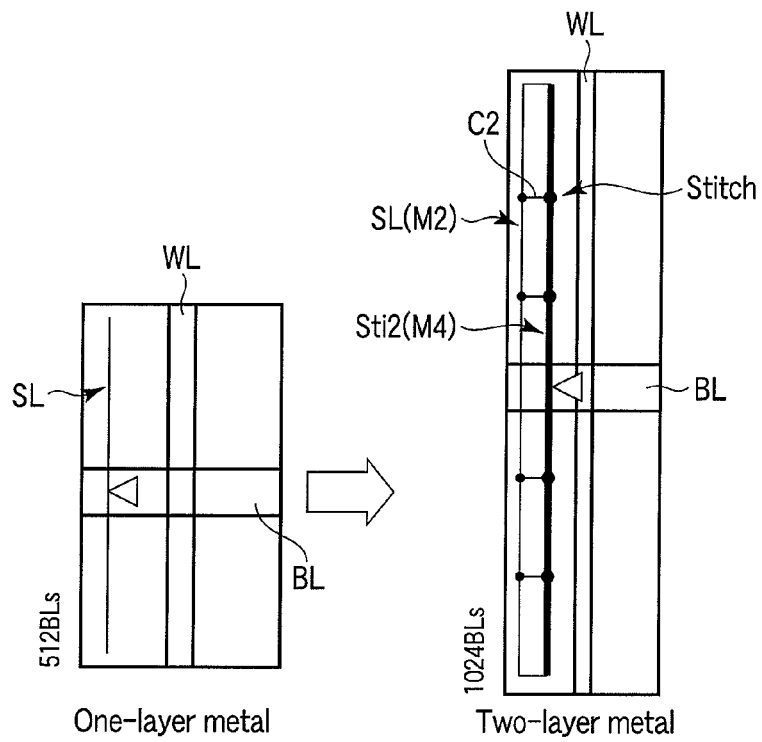
F I G. 24
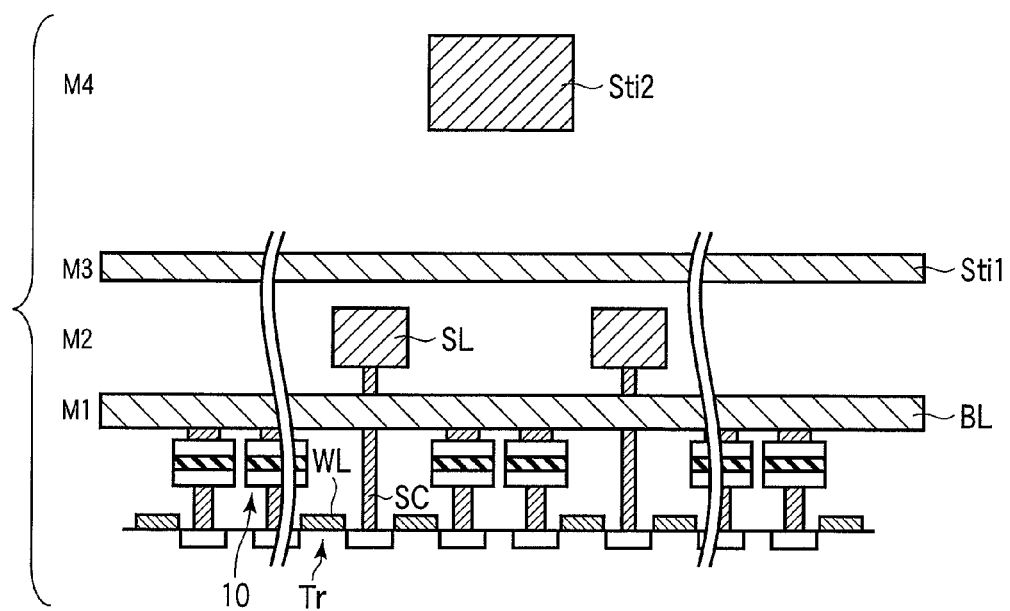
F I G. 25

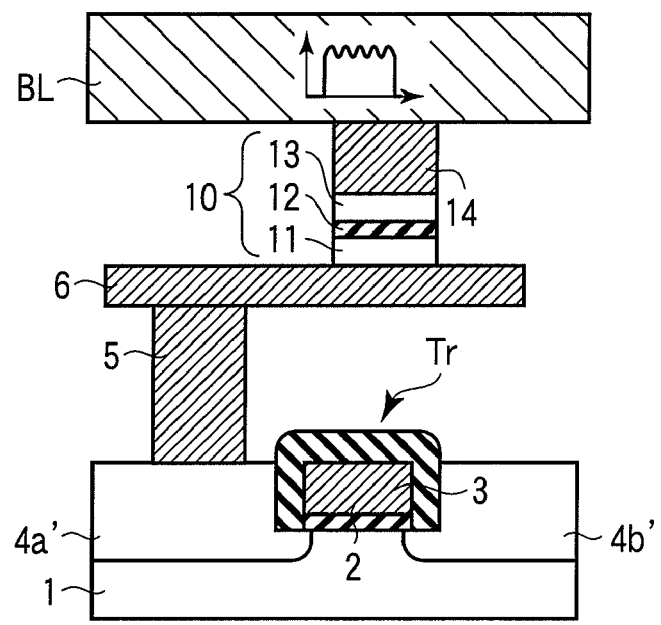
F I G. 27
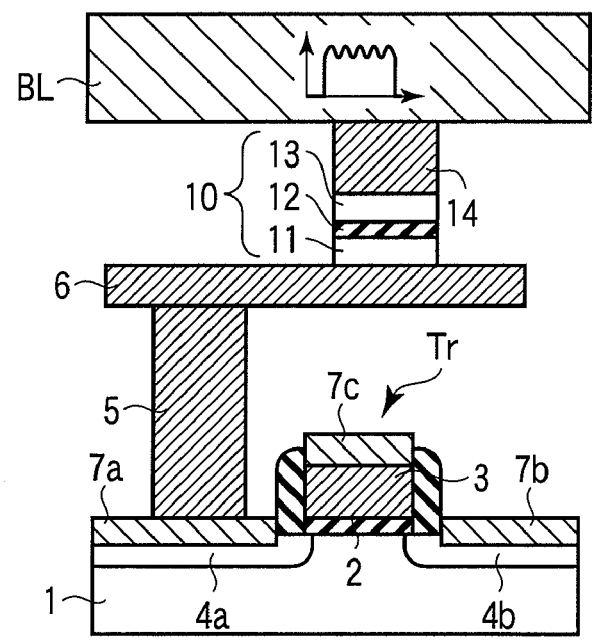
F I G. 28

MAGNETIC MEMORY

CROSS-REFERENCE TO RELATED APPLICATIONS

This application is based upon and claims the benefit of priority from prior Japanese Patent Application No. 2009-049366, filed Mar. 3, 2009, the entire contents of which are incorporated herein by reference.

BACKGROUND OF THE INVENTION

1. Field of the Invention

The present invention relates to a spin-transfer magnetic memory.

2. Description of the Related Art

In a spin-transfer magnetoresistive random access memory (MRAM), write and read operations are both carried out using a direct current. For this reason, there is a problem that a bit write error occurs in a read operation. At present, the spin-transfer MRAM has a problem that a write current is large. In order to solve the foregoing problem, write easiness of a magnetic film, i.e., damping constant is set higher. However, in this case, the foregoing write error frequently occurs.

U.S. Patent Application Publication No. US2003/0214834 is given as this kind of the related art.

BRIEF SUMMARY OF THE INVENTION

According to an aspect of the present invention, there is provided a spin-transfer magnetic memory comprising: a magnetoresistive element having a pinned layer, a free layer and a tunnel insulating layer provided between the pinned layer and the free layer; a bit line connected to one terminal of the magnetoresistive element; a select transistor having a current path whose one terminal is connected to the other terminal of the magnetoresistive element; a source line connected to the other terminal of the current path of the select transistor; and a pulse generation circuit passing a microwave pulse current through the magnetoresistive element, and assisting a magnetization switching of the free layer in a write operation.

BRIEF DESCRIPTION OF THE SEVERAL VIEWS OF THE DRAWING

FIG. 7 is a view showing a 1-write operation of a pulse generation circuit according to the second embodiment;

FIG. 8 is a view showing a 0-write operation of a pulse generation circuit according to the second embodiment;

FIG. 11 is a view to explain a stitch interconnect connected to a bit line according to a fifth embodiment of the present invention;

FIG. 12 is a view to explain a stitch interconnect connected to a source line according to the fifth embodiment;

FIG. 14 is a circuit diagram showing a one-sides stitch contact according to the fifth embodiment;

FIG. 24 is a schematic view to explain an extended direction of a source line according to a sixth embodiment of the present invention;

FIG. 25 is a cross-sectional view to explain an extended direction of a source line according to the sixth embodiment;

FIG. 27 is a cross-sectional view showing an MRAM having an elevated source/drain structure according to an eighth embodiment of the present invention; and FIG. 28 is a cross-sectional view showing an MRAM having a salicide structure according to a ninth embodiment of the present invention.

DETAILED DESCRIPTION OF THE INVENTION

Figure 1:
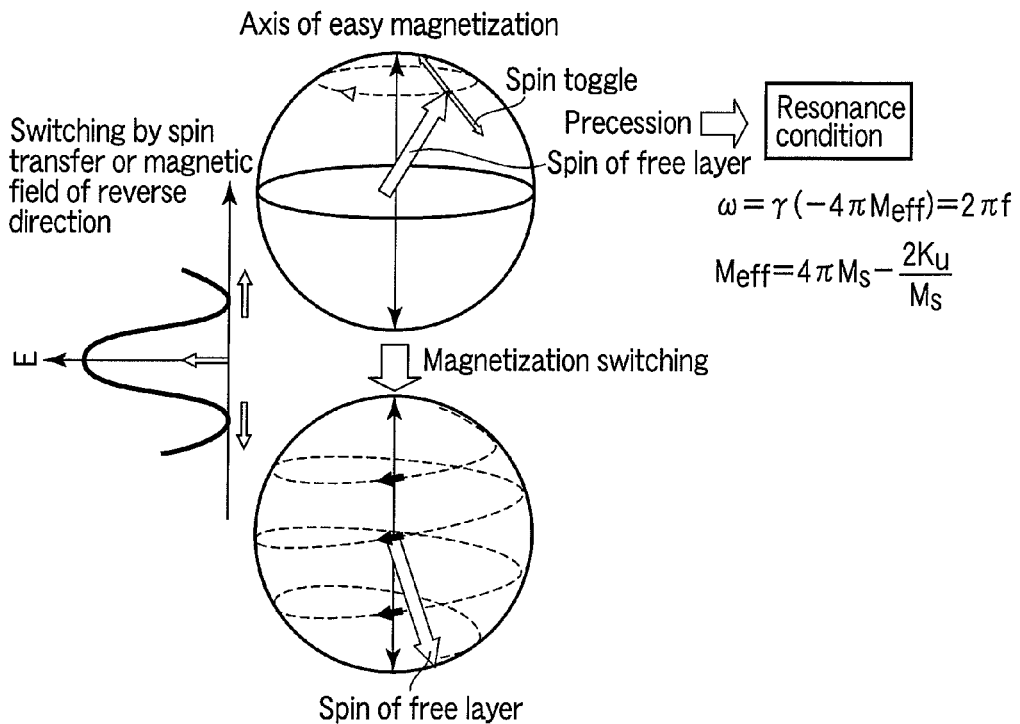
FIG. 1 is a view to explain spin transfer magnetization switching write of an MRAM according to a first embodiment of the present invention.

The embodiments of the present invention will be described hereinafter with reference to the accompanying drawings. In the description which follows, the same or functionally equivalent elements are denoted by the same reference numerals, to thereby simplify the description.

[1] First Embodiment

According to the first embodiment, magnetization switching (magnetization reversal) is assisted by using a direct pulse current in spin transfer write.

[1-1] Outline

Figure 2:
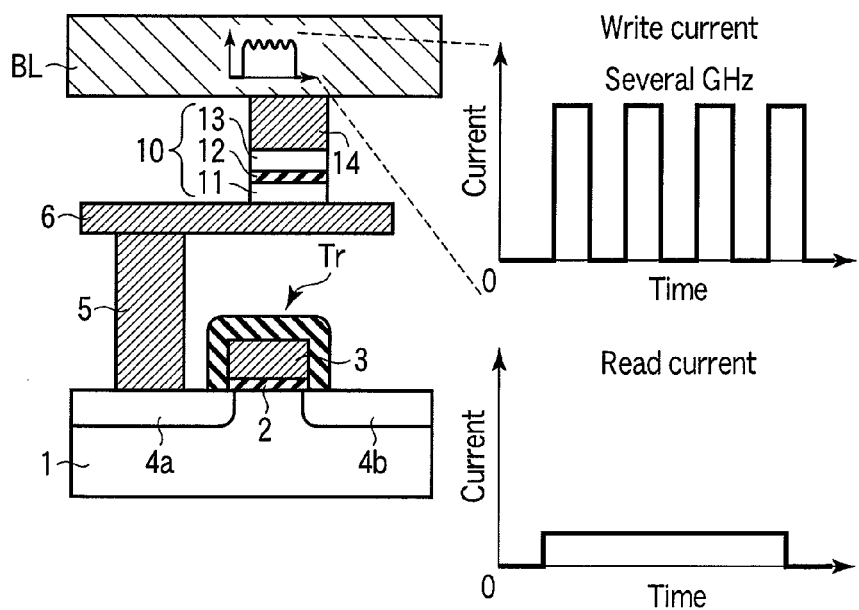
FIG. 2 is a view to explain write and read operations of an MRAM according to the first embodiment.

Referring now to FIGS. 1 and 2, the outline of spin transfer magnetization switching, write and read operations in an MRAM according to a first embodiment of the present invention will be described below.

As shown in FIG. 1, the spin of a free layer of a magnetic tunnel junction (MTJ) element of an MRAM precesses around the upward axis of easy magnetization. In this state, when a reverse-direction (downward direction in this embodiment) magnetic field or current is applied to the MTJ element, the spin of the free layer is switched (reversed).

For example, the structure of a memory cell of an MRAM is as follows. As shown in FIG. 2, a gate electrode 3 is formed on a semiconductor substrate 1 via a gate insulating film 2. Source/drain diffusion layers 4a and 4b are formed in the semiconductor substrate 1 by both sides of the gate electrode 3. In this way, a select transistor Tr is formed. The source/drain diffusion layer 4b is connected with a source line (not shown). The source/drain diffusion layer 4a is connected with an MTJ element (magnetoresistive effect element) 10 via a contact 5 and a bottom electrode 6. The MTJ element 10 comprises a pinned layer 11, a free layer 13, and a tunnel insulating layer 12 formed between the pinned layer 11 and the free layer 13. The pinned layer 11 of the MTJ element 10 is connected with a bit line BL via a contact 14.

According to this embodiment, magnetization switching assist effect by a pulse current signal is given to a write current in spin transfer magnetization switching write. The pulse current is several GHz microwave direct current, which flows by a predetermined time at predetermined intervals.

If the frequency f of the foregoing pulse current satisfies the following equation (1), resonance occurs. ω is a angular frequency. When the resonance occurs, the vibration of precession becomes large; therefore, the spin is easily switched even if a reverse-direction magnetic filed or current is small. In the following equation (1), Ms denotes a saturation magnetization of a magnetic layer, Ku denotes a magnetic anisotropy energy density of a magnetic layer and γ denotes a gyromagnetic ratio.

$$\omega = 2\pi f = \gamma(-4\pi Meff)$$

$$Meff = 4\pi Ms - 2Ku/Ms \quad (1)$$

In this case, the saturation magnetization Ms and the magnetic anisotropy energy density Ku of the free layer 13 are set based on the material of the free layer 13 so that a condition of generating the resonance vibration of the equation (1) is satisfied. Conversely, the saturation magnetization Ms and the magnetic anisotropy energy density Ku of the pinned layer 11 are set based on the material of the pinned layer 11 so that a condition of generating no resonance vibration of the equation (1) is satisfied. In this way, it is possible to prevent error switching of the spin of the pinned layer 11.

A normal direct current is used as a read current. The magnetic material is set such that the spin is easily switched in the write operation only while being not easily switched in the read operation. In this way, a defect such as error write is hard to occur in the read operation. Further, the operating margin as a device is widened, and a feasibility of the device becomes high.

[1-2] Pulse Generation Circuit

One example of a pulse current generation circuit according to this embodiment will be described below with reference to FIGS. 3 and 4.

Figure 3:
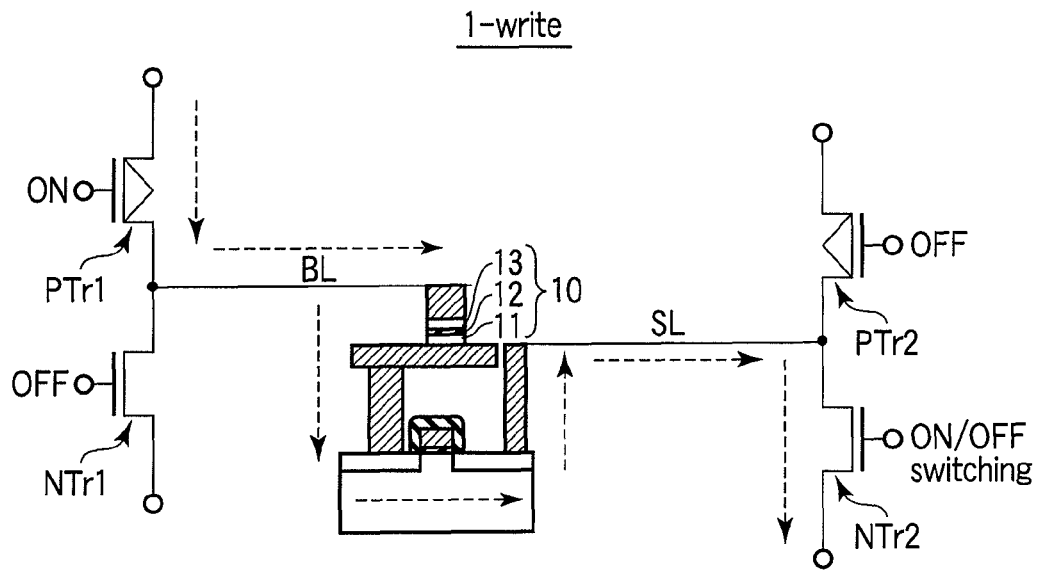
FIG. 3 is a view showing a 1-write operation of a pulse generation circuit according to the first embodiment.
Figure 4:
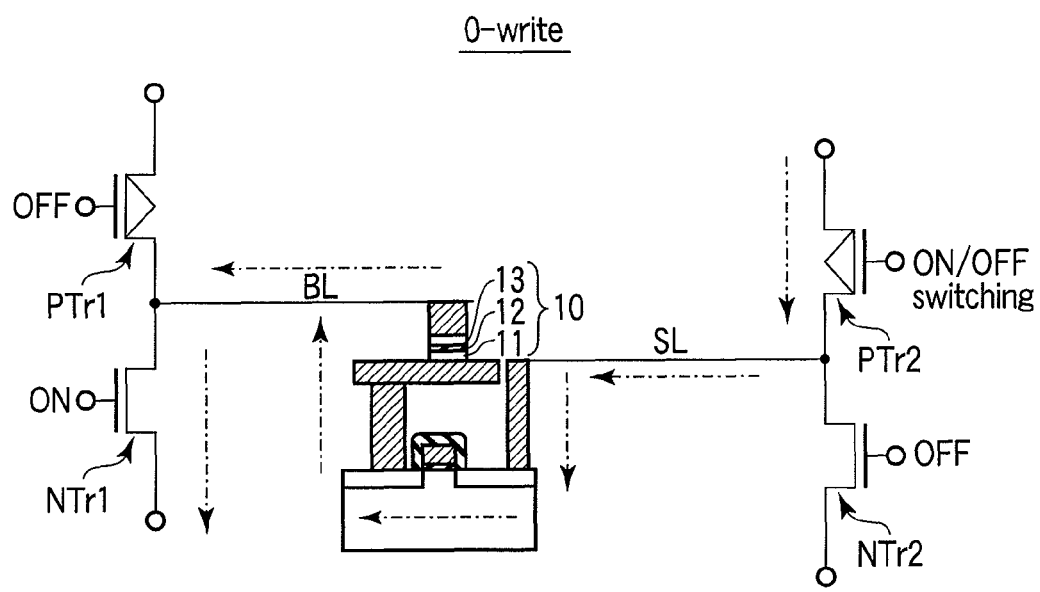
FIG. 4 is a view showing a 0-write operation of a pulse generation circuit according to the first embodiment.

As shown in FIGS. 3 and 4, both terminals of a write interconnect are connected with P-channel transistors PTr1, PTr2 and N-channel transistors NTr1, NTr2. A bidirectional write current flows through the write interconnect according to on/off switching of P-channel transistors PTr1, PTr2 and N-channel transistors NTr1, NTr2.

Specifically, a bit line BL is connected with P-channel transistor PTr1 and N-channel transistor NTr1. In P-channel transistor PTr1, one terminal of a current path is connected to a first power terminal (e.g., power source Vdd) while the other terminal thereof is connected to the bit line BL. In N-channel transistor NTr1, one terminal of a current path is connected to a second power terminal (e.g., power source Vss) while the other terminal thereof is connected to the bit line BL.

A source line SL is connected with P-channel transistor PTr2 and N-channel transistor NTr2. In P-channel transistor PTr2, one terminal of a current path is connected to a first power terminal while the other terminal thereof is connected to the source line SL. In N-channel transistor NTr2, one terminal of a current path is connected to a second power terminal while the other terminal thereof is connected to the source line SL.

[Write Operation]

The write operation using a pulse current according to this embodiment will be described below with reference to FIGS. 3 and 4. In this operation, the case of passing a write current from the free layer toward the pinned layer is defined as a 1-write. Conversely, the case of passing a write current from the pinned layer toward the free layer is defined as a 0-write. Of course, 1- and 0-write may be defined as the reverse of the foregoing cases.

According to this embodiment, the pulse current in the write operation is generated by turning on/off one of two transistors located on both sides of an on-state cell in a normal operation. An on/off signal is easily generated in a memory circuit.

Specifically, in the case of 1-write, a write current flows from the free layer 13 to the pinned layer 11 as seen from FIG. 3. In this case, P-channel transistor PTr2 and N-channel transistor NTr1 are turned off. P-channel transistor PTr1 is turned on while N-channel transistor NTr2 is alternately switched between on and off states. In this way, a pulse write current flows from P-channel transistor PTr1 toward N-channel transistor NTr2. In other words, a direct current flows through the MTJ element 10 when N-channel transistor NTr2 is on. When N-channel transistor NTr2 is off, write current does not flow through the MTJ element 10. In this way, magnetization switching assist effect by the pulse current is given.

In the case of 0-write, a write current flows from the pinned layer 11 to the free layer 13 as seen from FIG. 4. In this case, P-channel transistor PTr1 and N-channel transistor NTr2 are turned off. N-channel transistor NTr1 is turned on while P-channel transistor PTr2 is alternately switched between on and off states. In this way, a pulse write current flows from P-channel transistor PTr2 toward N-channel transistor NTr1. In other words, a direct current flows through the MTJ element 10 when P-channel transistor PTr2 is on. When P-channel transistor PTr2 is off, write current does not flow through the MTJ element 10. In this way, magnetization switching assist effect by the pulse current is given.

In the 1-write case, N-channel transistor NTr2 is turned on, and P-channel transistor PTr1 may be alternately switched between on and off states. Likewise, in the 0-write case, P-channel transistor PTr2 is turned on, and N-channel transistor NTr1 may be alternately switched between on and off states.

[1-4] Effect

According to the first embodiment, in a write operation, on/off of transistors connected to both terminals of a cell is switched, and thereby, a pulse current is generated. The pulse write current satisfies a resonance condition, and thereby, precession vibration becomes large; therefore, the spin of the free layer 13 is easy to be switched. Microwave current assist effect is given to a write current of spin transfer magnetization switching, and thereby, write can be performed by a current smaller than usual. Read using the direct current only is independent from write in its operation mechanism. Therefore, read disturb is hard to occur; as a result, it is possible to increase an operating margin between write and read. Thus, this serves to increase a bit capacity, and to achieve high feasibility of a large-capacity memory.

Figure 5:
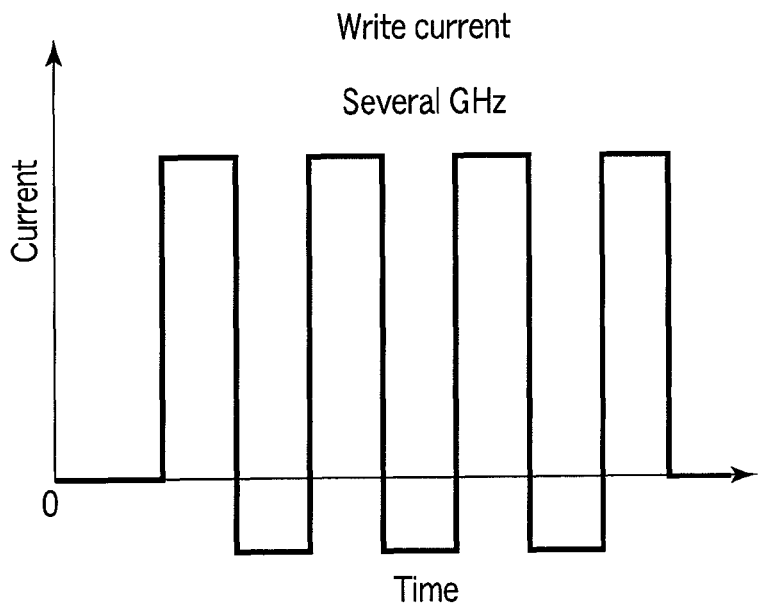
FIG. 5 is a waveform chart showing another write current according to the first embodiment.

According to the write operation of this embodiment, the microwave pulse current may include a current component in a reverse directional to spin switching depending on a frequency, as show in FIG. 5. Namely, a write current of the revere direction (minus direction in FIG. 5) to spin switching is passed through the MTJ element 10 for a time when the write current of FIG. 2 is zero. In this case, it is desirable that the value of the write current passed in the minus direction reverse to spin switching is smaller than that passed in the plus direction for providing spin switching.

[2] Second Embodiment

According to the first embodiment, a direct pulse current is used in a write operation. Conversely, according to the second embodiment, a current of the sum of direct current and pulse (alternate current) is used.

[2-1] Outline

Figure 6:
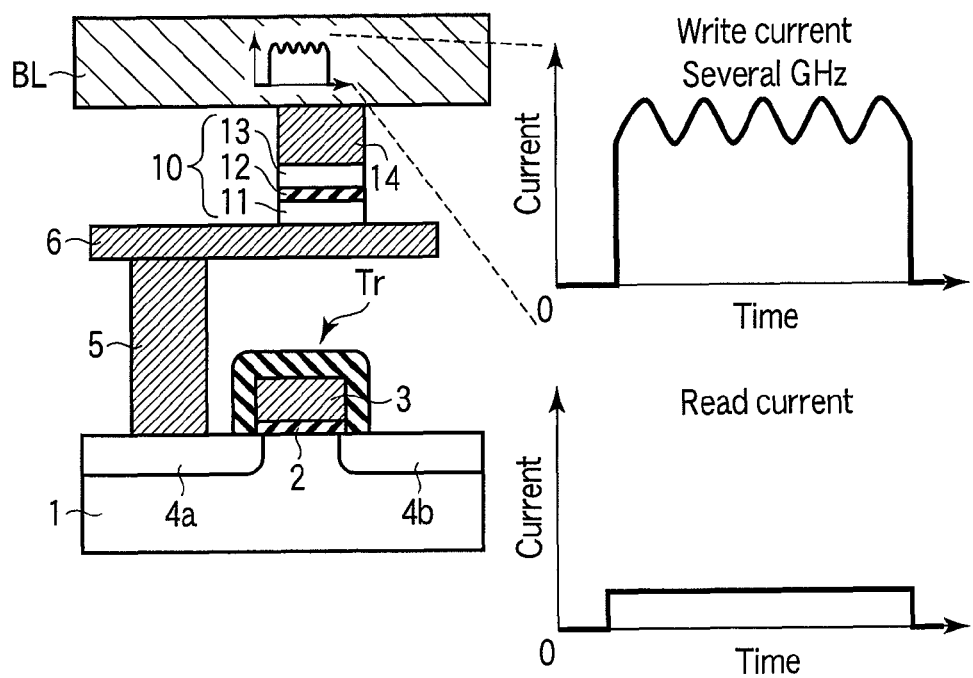
FIG. 6 is a view to explain write and read operations of an MRAM according to a second embodiment of the present invention.

Referring to FIG. 6, the outline of write and read operations in an MRAM according to a second embodiment of the present invention will be described below.

As can be seen from FIG. 6, the second embodiment differs from the first embodiment in a write current waveform. The write current is provided as a pulse (alternate current) by switching two direct currents having different potentials every predetermined time. The pulse current periodically changes between two potentials, and always flows in a write operation.

[2-2] Pulse Generation Circuit

One example of a pulse current generation circuit according to this embodiment will be described below with reference to FIGS. 7 and 8.

As shown in FIGS. 7 and 8, both terminals of a write interconnect are connected with P-channel transistors PTr1, PTr2, PTr3 and N-channel transistors NTr1, NTr2, NTr3. A bidirectional write current flows through the write interconnect according to on/off switching of P-channel transistors PTr1, PTr2, PTr3 and N-channel transistors NTr1, NTr2, NTr3.

Specifically, a bit line BL is connected with P-channel transistor PTr1 and N-channel transistor NTr1. In P-channel transistor PTr1, one terminal of a current path is connected to a first power terminal (e.g., power source Vdd) while the other terminal thereof is connected to the bit line BL. In N-channel transistor NTr1, one terminal of a current path is connected to a second power terminal (e.g., power source Vss) while the other terminal thereof is connected to the bit line BL.

A source line is connected with P-channel transistors PTr2, PTr3 and N-channel transistors NTr2, NTr3. In P-channel transistor PTr2, one terminal of a current path is connected to a power terminal having a potential B while the other terminal thereof is connected to the source line. In P-channel transistor PTr3, one terminal of a current path is connected to a power terminal having a potential A while the other terminal thereof is connected to the source line. In N-channel transistor NTr2, one terminal of a current path is connected to a power terminal having the potential B while the other terminal thereof is connected to the source line. In N-channel transistor PTr3, one terminal of a current path is connected to a power terminal having the potential A while the other terminal thereof is connected to the source line. The voltages (potentials) A and B are different from each other, and larger than voltage Vss and smaller than voltage Vdd.

[2-3] Write Operation

The write operation using a pulse current according to this embodiment will be described below with reference to FIGS. 7 and 8. In this operation, the case of passing a write current from the free layer toward the pinned layer is defined as a 1-write. Conversely, the case of passing a write current from the pinned layer toward the free layer is defined as a 0-write. Of course, 1- and 0-write may be defined as the reverse of the foregoing cases.

According to the write operation of this embodiment, a pulse current changing between two potentials is generated in the following manner. Namely, two transistors for applying two different potentials are connected to one terminal of a cell, and then, the two transistors are alternately connected to the cell.

Specifically, in the case of 1-write, a write current flows from the free layer 13 to the pinned layer 11 as seen from FIG. 7. In this case, P-channel transistors PTr2, PTr3 and N-channel transistor NTr1 are turned off. P-channel transistor PTr1 is turned on while N-channel transistors NTr2 and NTr3 are alternately switched between on and off states and set to complementary states.

N-channel transistors NTr2 and NTr3 are set to the following complementary states. Specifically, when N-channel transistor NTr2 is on, N-channel transistor NTr3 is turned off. Conversely, when N-channel transistor NTr2 is off, N-channel transistor NTr3 is turned on. In this case, power supply potentials of N-channel transistors NTr2 and NTr3 are different from each other. In this embodiment, the power supply potential of N-channel transistor NTr2 is set to the potential B while the power supply potential of N-channel transistor NTr3 is set to the potential A.

In this way, the following cases are alternately repeated. Namely, one is the case where a write current flows from P-channel transistor PTr1 toward N-channel transistor NTr2. The other is the case where a write current flows from P-channel transistor PTr1 toward N-channel transistor NTr3. The foregoing operation is carried out, and thereby, magnetization switching assist effect by the pulse current is given.

In the case of 0-write, a write current flows from the pinned layer 11 to the free layer 13 as seen from FIG. 8. In this case, P-channel transistor PTr1, N-channel transistors NTr2 and NTr3 are turned off. N-channel transistor NTr1 is turned on while P-channel transistors PTr2 and PTr3 are alternately switched between on and off states and set to complementary states.

P-channel transistors PTr2 and PTr3 are set to the following complementary states. Specifically, when P-channel transistor PTr2 is on, P-channel transistor PTr3 is turned off. Conversely, when P-channel transistor PTr2 is off, P-channel transistor PTr3 is turned on. In this case, power supply potential of P-channel transistors PTr2 and PTr3 are different from each other. In this embodiment, the power supply potential of P-channel transistor NTr2 is set to the potential B while the power supply potential of P-channel transistor PTr3 is set to the potential A.

In this way, the following cases are alternately repeated. Namely, one is the case where a write current flows from P-channel transistor PTr2 toward N-channel transistor NTr1. The other is the case where a write current flows from P-channel transistor PTr3 toward N-channel transistor NTr1. The foregoing operation is carried out, and thereby, magnetization switching assist effect by the pulse current is given.

[2-4] Effect

According to the second embodiment, the same effect as the first embodiment is obtained. Further, according to the second embodiment, a current of the sum of direct current and pulse is used as a write current, and thereby, time that a write current becomes fully 0 A in the write operation is not made. Therefore, spin contributing to magnetization switching is always transferred to the MTJ element 10. Further, a pulse signal is given to the MTJ element 10; therefore, low-current effect due to resonance is expected.

According to the first and second embodiments, each transistor of the pulse generation circuit is directly connected to cell terminal. For example, even if each transistor is connected to cell terminal via an address select switch or an address select circuit, the same effect as the first and second embodiments is obtained. In this case, there is no need to provide each transistor every bit line; therefore, this serves to reduce the chip size.

The pulse write current of the first and second embodiment is generated by a method using a normal inductance and a transformer circuit.

Third Embodiment

Figure 9:
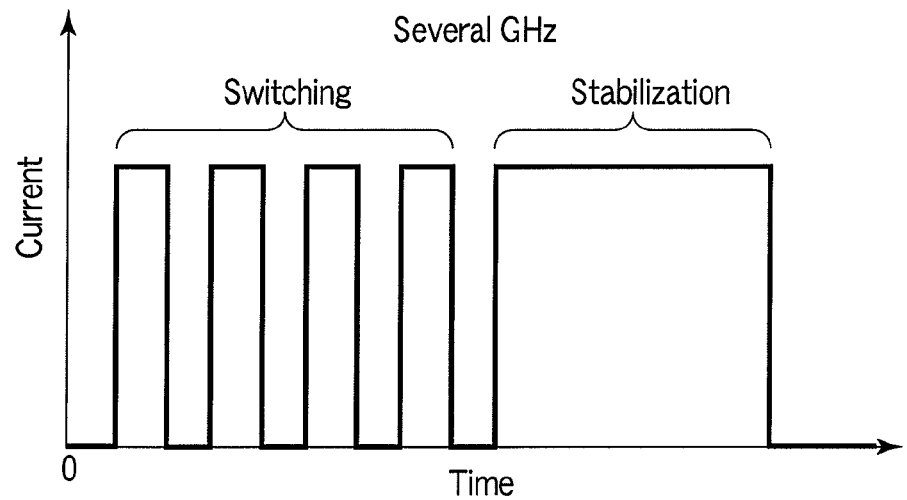
FIG. 9 is a waveform chart showing a write current according to a third embodiment of the present invention.

As shown in FIG. 9, according to the write operation of the third embodiment, a current having a long normal direct current component is used for a predetermined time after the direct pulse current described in the first embodiment is used. In this case, a direct current used second half has a pulse length, which does not satisfy the resonance condition of the equation (1). Preferably, the second-half direct current flows longer than time per a pulse of the pulse current.

According to the third embodiment, the same effect as the first embodiment is obtained, and further, a stabilization process that amplified precession converges is obtained. Therefore, it is possible to improve the accuracy of the write direction.

Fourth Embodiment

Figure 10:
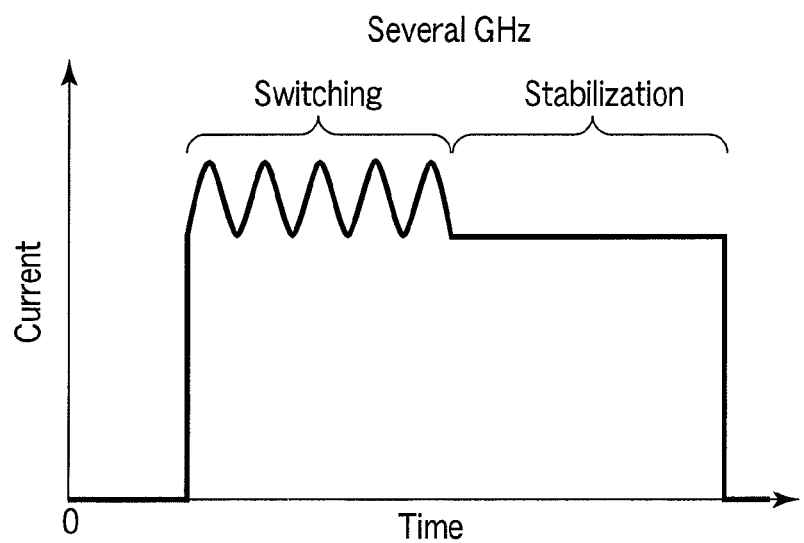
FIG. 10 is a waveform chart showing a write current according to a fourth embodiment of the present invention.

As shown in FIG. 10, according to the write operation of the fourth embodiment, a current having a long normal direct current component is used after the pulse current described in the second embodiment is used. In this case, a direct current used second half has a pulse length, which does not satisfy the resonance condition of the equation (1). Preferably, the second-half direct current flows longer than time per a pulse of the pulse current.

According to the fourth embodiment, the same effect as the second embodiment is obtained, and further, a stabilization process that amplified precession converges is obtained. Therefore, it is possible to improve the accuracy of the write direction.

[5] Fifth Embodiment

[5-1] Outline

According to the foregoing embodiments, a pulse current is used in the write operation, and thereby, the effect of performing a low current in the write operation is obtained. However, bit lines and source lines used for the write operation are connected to a substrate by using contacts, and these contacts are formed near the gate sidewall. For this reason, there is the possibility that substrate capacitance and gate capacitance increases. As a result, even if a pulse current is supplied to write interconnects, there is the possibility that the pulse is not transmitted to the cell terminal.

In order to solve the foregoing problem, according to the fifth embodiment, a stitch-shaped interconnect (hereinafter, referred to as a stitch interconnect) is formed as an upper-layer interconnect above a bit line and a source line. The stitch interconnect comprises contacts located at a wide space. The stitch interconnect is formed, and thereby, it is possible to reduce a pulse signal loss resulting from the foregoing capacitance.

Specifically, as shown in FIG. 11, a bit line BL is connected with a stitch interconnect Sti1 via a stitch contact C1. As shown in FIG. 12, a source line SL is connected with a stitch interconnect Sti2 via a stitch contact C2. Stitch contacts C1 and C2 are arrayed on the edge portion of a memory cell array so that a space between stitch contacts C1 and C2 is widely secured.

Stitch interconnect Sti1 is arranged above the bit line BL while stitch interconnect Sti2 is arranged above the source line SL. Stitch interconnects Sti1 and Sti2 are a low-resistance interconnect lower than bit line BL and source line SL. Specifically, stitch interconnects Sti1 and Sti2 have interconnect widths wider than bit line and source line, respectively. Further, stitch interconnects Sti1 and Sti2 have interconnect thicknesses thicker than bit line BL and source line, respectively. Furthermore, stitch interconnects Sti1 and Sti2 are formed of a material having specific resistance lower than bit line BL and source line SL. Stitch interconnect Sti1 is connected to the bit line BL only via the contact C1, and not connected to interconnects other than the bit line BL. Stitch interconnect Sti2 is connected to the source line SL only via the contact C2, and not connected to interconnects other than the source line SL. Stitch interconnects Sti1 and Sti2 may be arranged at the same level or the different level. Stitch interconnect Sti1 is extended to the same direction as the bit line BL while stitch interconnect Sti2 is extended to the same direction as the source line SL.

[5-2] Arrangement of Stitch Contact

The arrangement of stitch contact according to this embodiment will be described below with reference to FIGS. 13 and 14.

Figure 13:
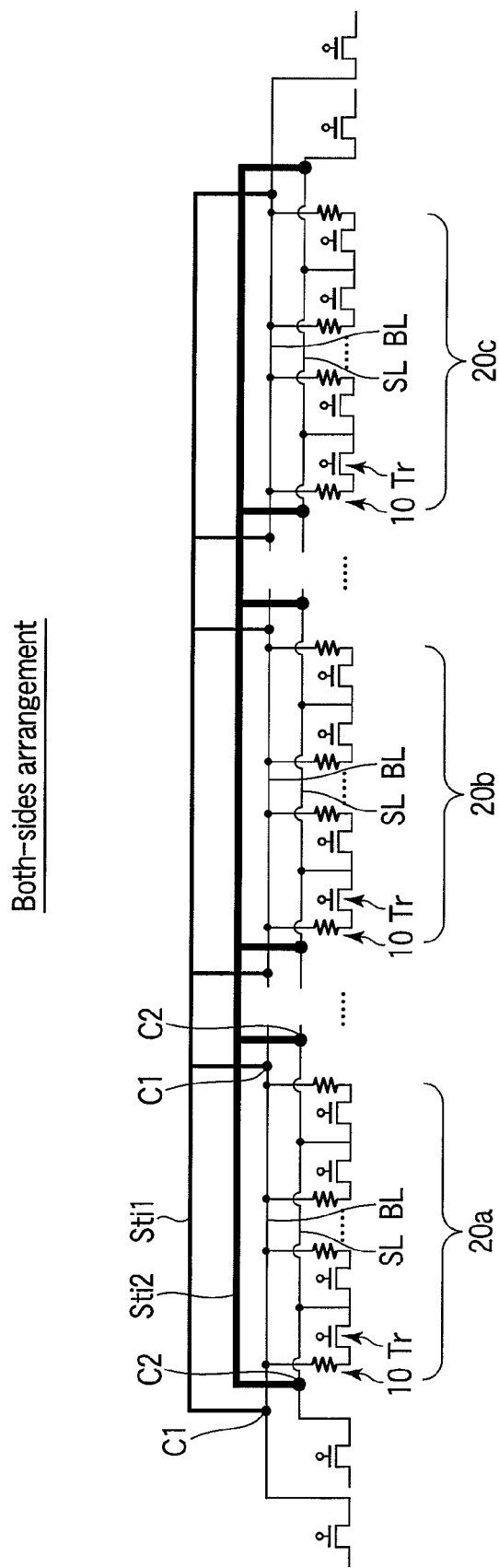
FIG. 13 is a circuit diagram showing a both-sides stitch contact according to the fifth embodiment.

As can be seen from FIGS. 13 and 14, an MRAM memory cell array comprises memory cell arrays 20a, 20b and 20c. Memory cell arrays 20a, 20b and 20c are each formed having a plurality of memory cells.

As shown in FIG. 13, stitch contacts C1 may be arranged on both-side edges of each of memory cell arrays 20a, 20b and 20c on the bit line BL. Likewise, stitch contacts C2 may be arranged on both-side edges of each of memory cell arrays 20a, 20b and 20c on the source line SL. In this case, stitch contacts C1 and C2 are arranged on both sides of each of memory cell arrays 20a, 20b and 20c, and thereby, this serves to reduce a pulse signal loss resulting from substrate capacitance and gate capacitance.

As can be seen from FIG. 14, stitch contact C1 may be arranged on one-side edge of each of memory cell arrays 20a, 20b and 20c on the bit line BL. Likewise, stitch contact C2 may be arranged on one-side edge of each of memory cell arrays 20a, 20b and 20c on the source line SL. In this case, preferably, stitch contacts C1 and C2 are respectively arranged at different edges of each of memory cell arrays 20a, 20b and 20c. In this way, the area occupied by stitch contacts C1 and C2 is reduced, and further, it is possible to attain a margin in the arrangement pitch of stitch contacts C1 and C2.

[5-3] $6F^2$ Layout

Figure 15:
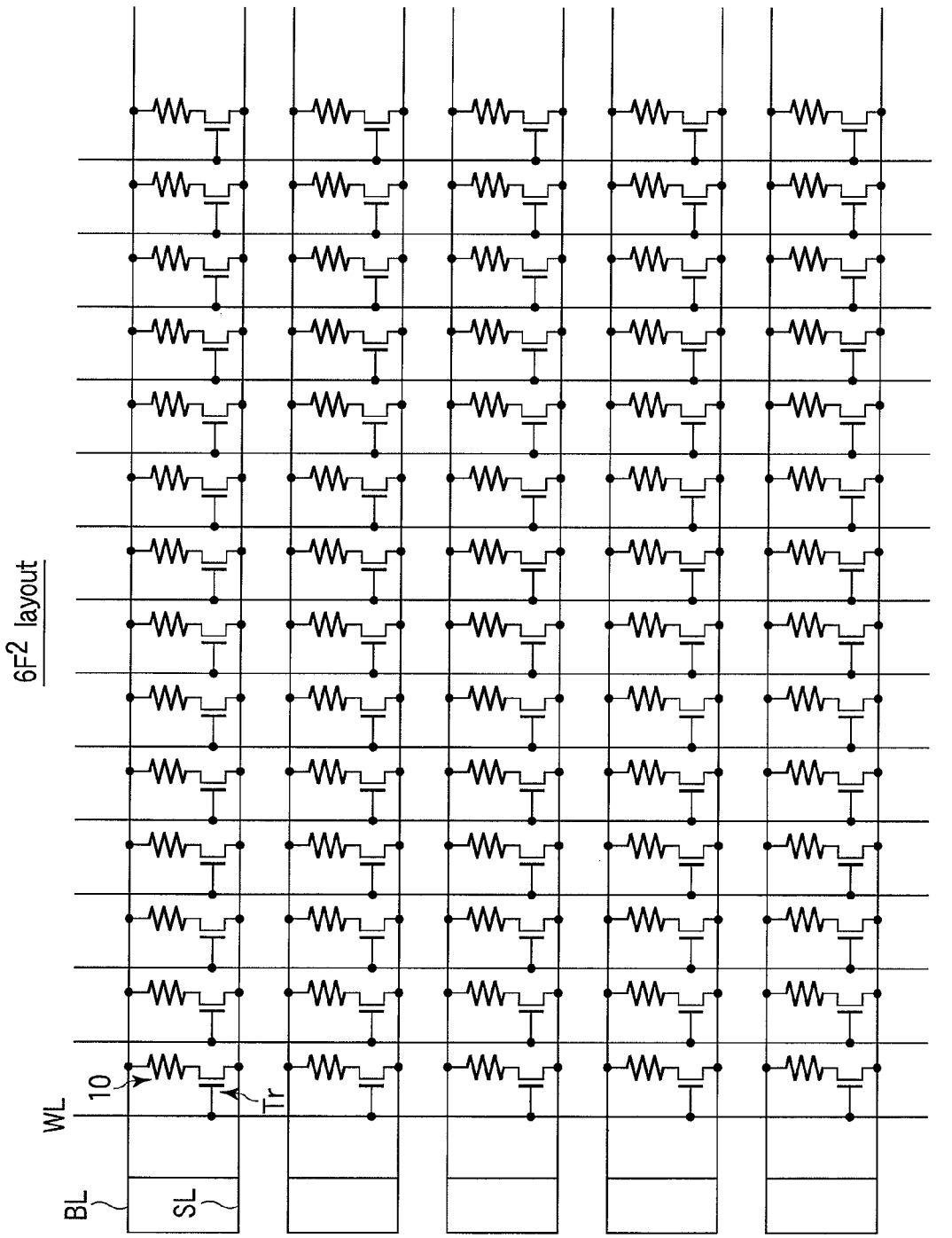
FIG. 15 is a circuit diagram showing a $6F^2$ layout according to the fifth embodiment.

In a $6F^2$ layout shown in FIG. 15, the layout of the following cases will be described below. One is the case (FIG. 16) where stitch contacts C1 and C2 are arranged on both sides of a memory cell array. The other is the case (FIG. 17) where stitch contacts C1 and C2 are arranged on one side of a memory cell array.

Figure 16:
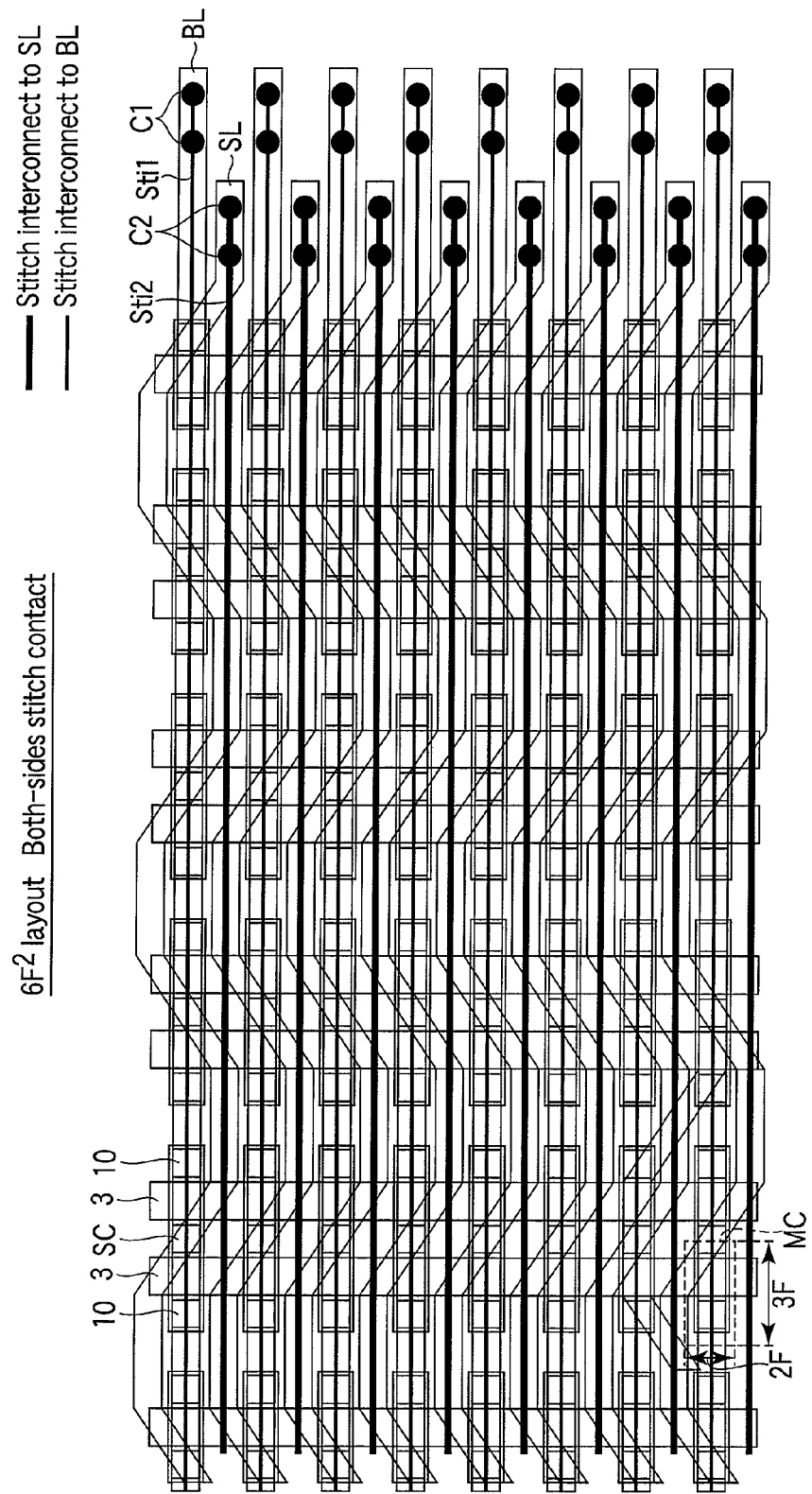
FIG. 16 is schematic view showing a both-sides stitch contact in a $6F^2$ layout according to the fifth embodiment.
Figure 17:
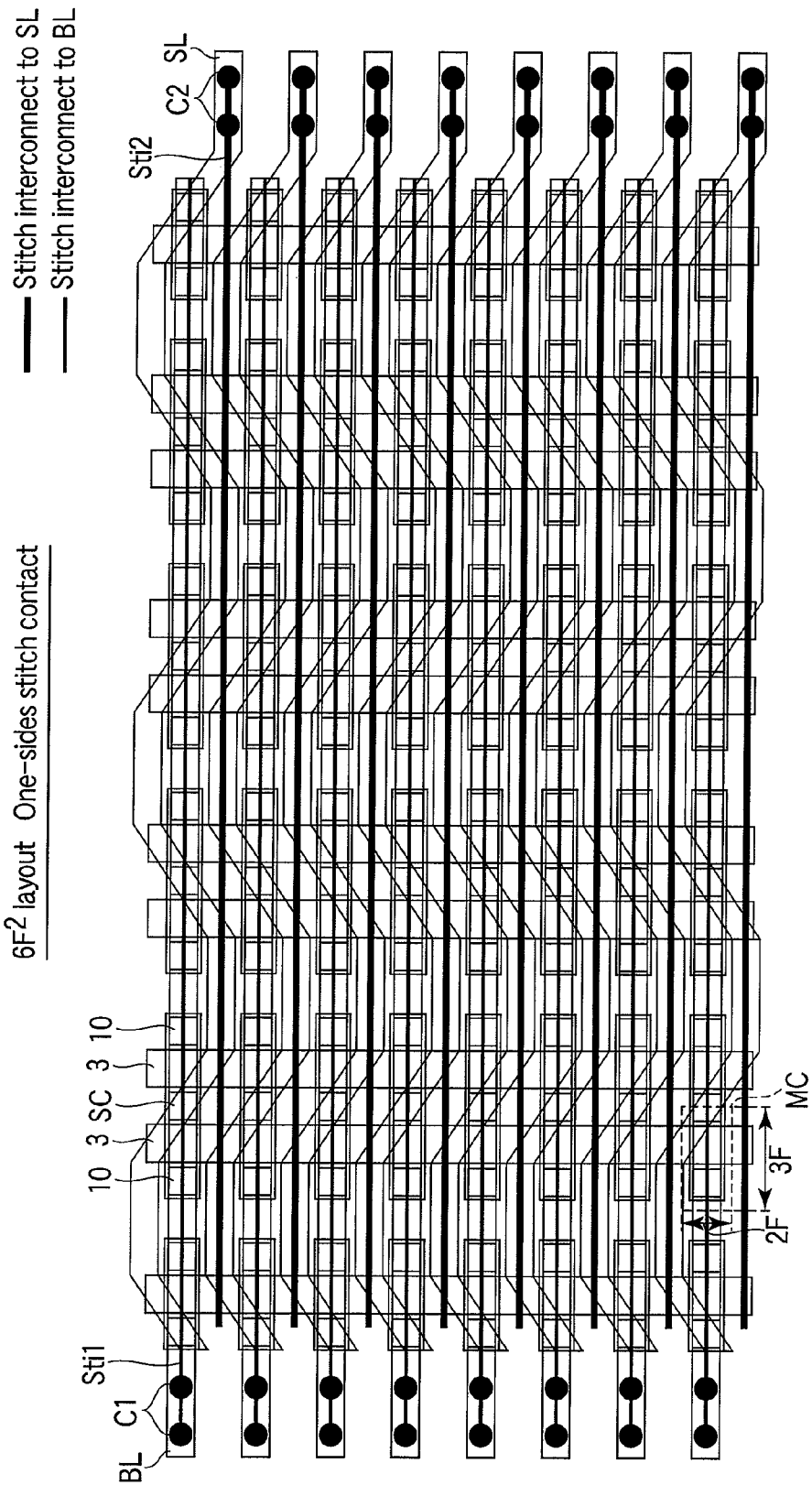
FIG. 17 is schematic view showing a one-sides stitch contact in a $6F^2$ layout according to the fifth embodiment.

According to the case where stitch contacts C1 and C2 are arranged on both sides of a memory cell array, both stitch contacts C1 and C2 are arranged on one-side edge of a memory cell array as can be seen from FIG. 16. In this case, preferably, stitch contacts C1 and C2 are arranged in a state of being shifted so that they are not lined on the word line direction.

According to the case where stitch contacts C1 and C2 are arranged on one side of a memory cell array, stitch contact C1 is arranged on one edge of a memory cell array while stitch contact C2 is arranged on the other edge thereof.

[5-4] 8F² Layout (1)

Figure 18:
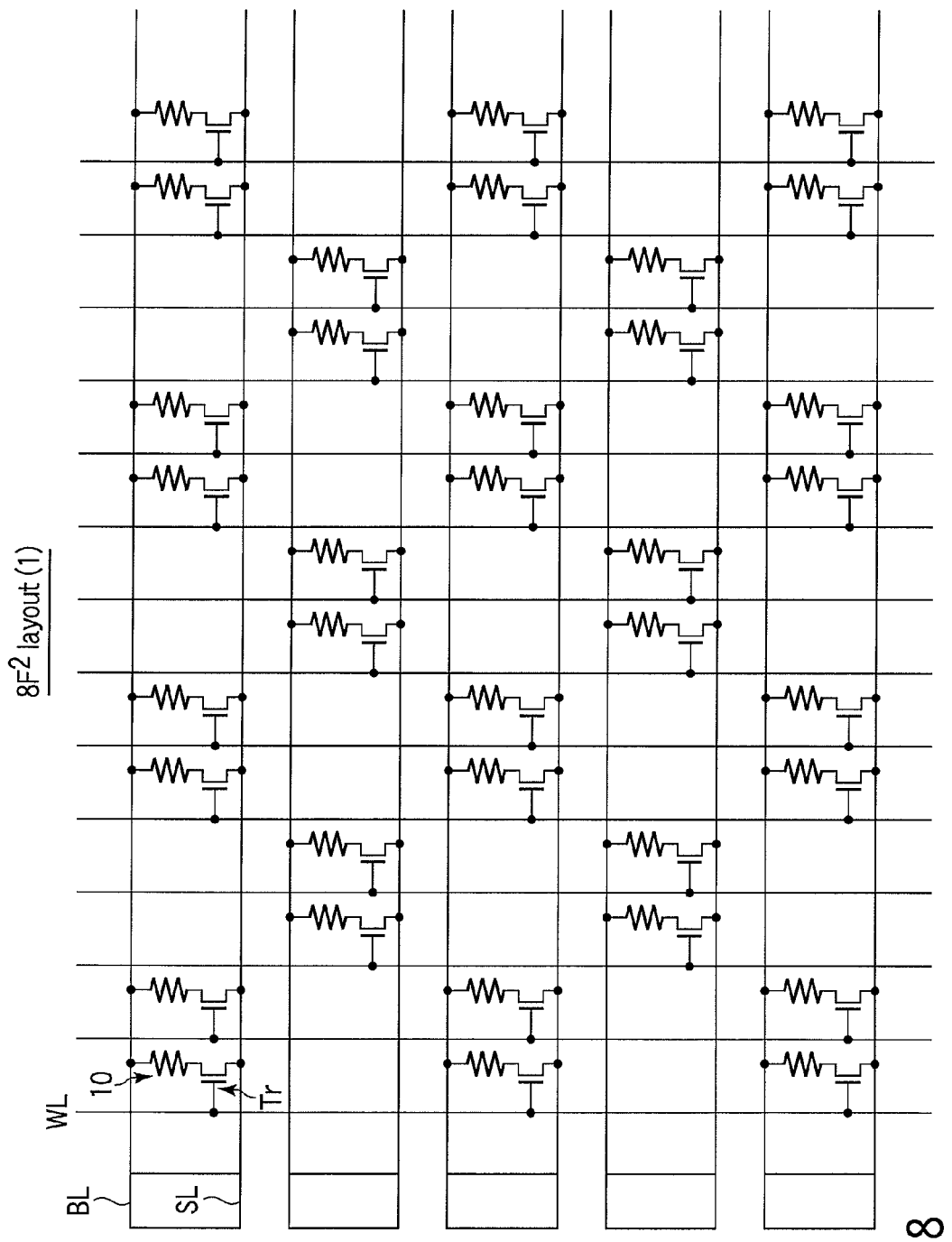
FIG. 18 is a circuit diagram showing an $8F^2$ layout (1) according to the fifth embodiment.

In an 8F² layout (1) shown in FIG. 18, the layout of the following cases will be described below. One is the case (FIG. 19) where stitch contacts C1 and C2 are arranged on both sides of a memory cell array. The other is the case (FIG. 20) where stitch contacts C1 and C2 are arranged on one side of a memory cell array.

Figure 19:
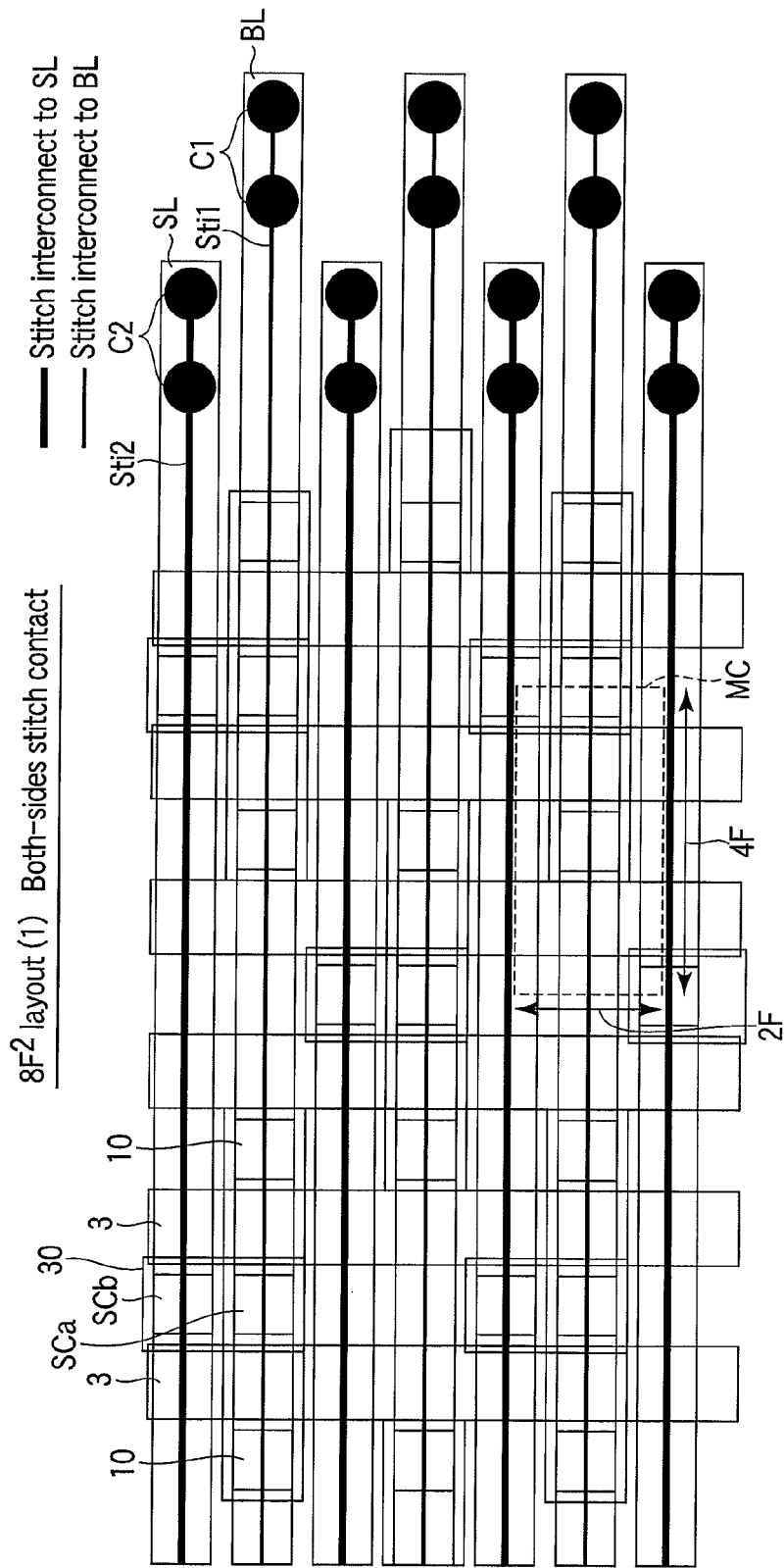
FIG. 19 is schematic view showing a both-sides stitch contact in a $8F^2$ layout (1) according to the fifth embodiment.
Figure 20:
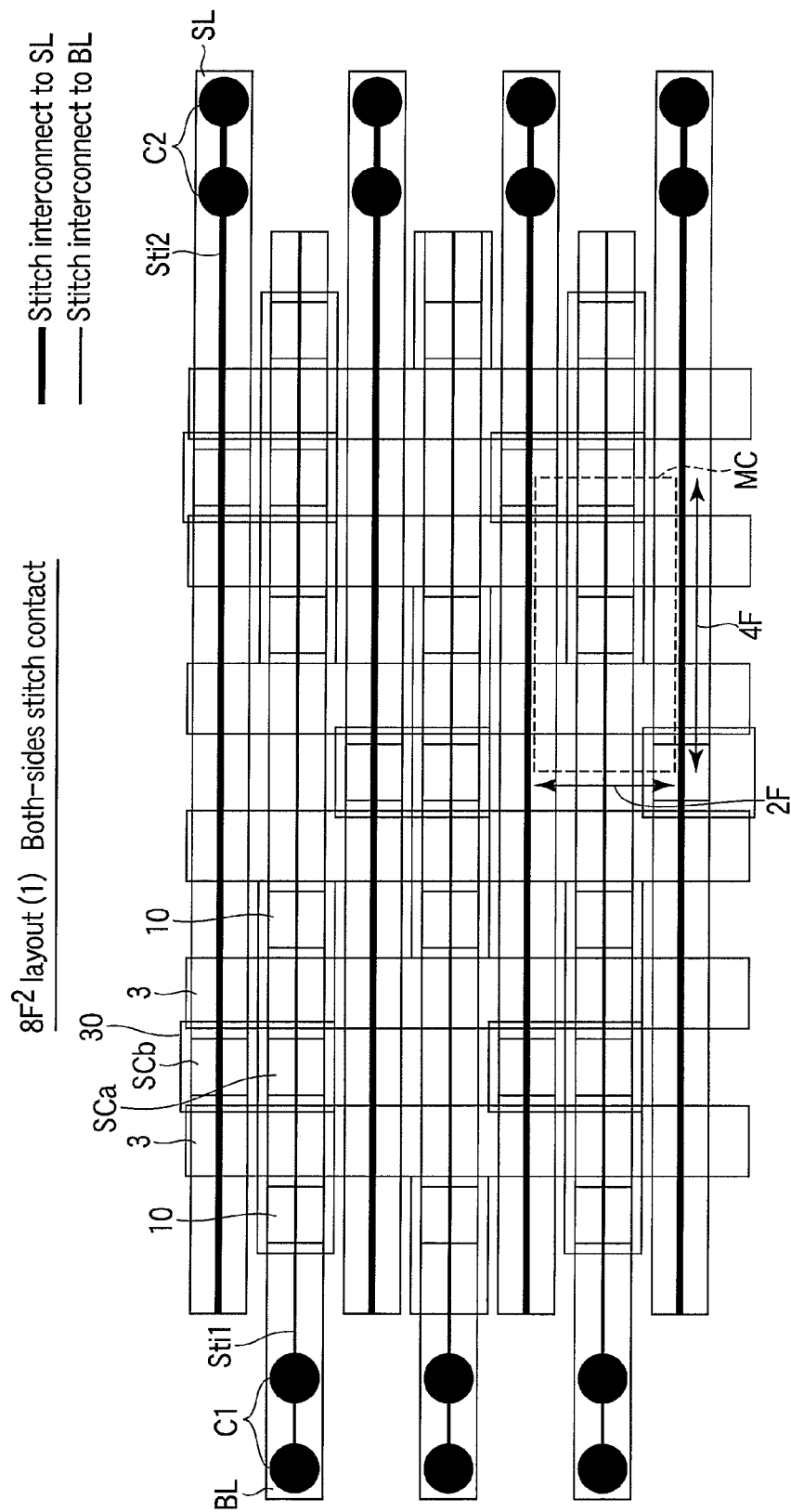
FIG. 20 is schematic view showing a one-sides stitch contact in a $8F^2$ layout (1) according to the fifth embodiment.

According to the case where stitch contacts C1 and C2 are arranged on both sides of a memory cell array, both stitch contacts C1 and C2 are arranged on one-side edge of a memory cell array as can be seen from FIG. 19. In this case, preferably, stitch contacts C1 and C2 are arranged in a state of being shifted so that they are not lined on the word line direction.

According to the case where stitch contacts C1 and C2 are arranged on one side of a memory cell array, stitch contact C1 is arranged on one edge of a memory cell array while stitch contact C2 is arranged on the other edge thereof.

[5-5] 8F² Layout (2)

According to the foregoing 6F² layout and 8F² layout (1), bit line BL and source line SL are arranged at different interconnect levels. Conversely, according to 8F² layout (2), bit line BL and source line SL are arranged at the same interconnect level.

Figure 21:
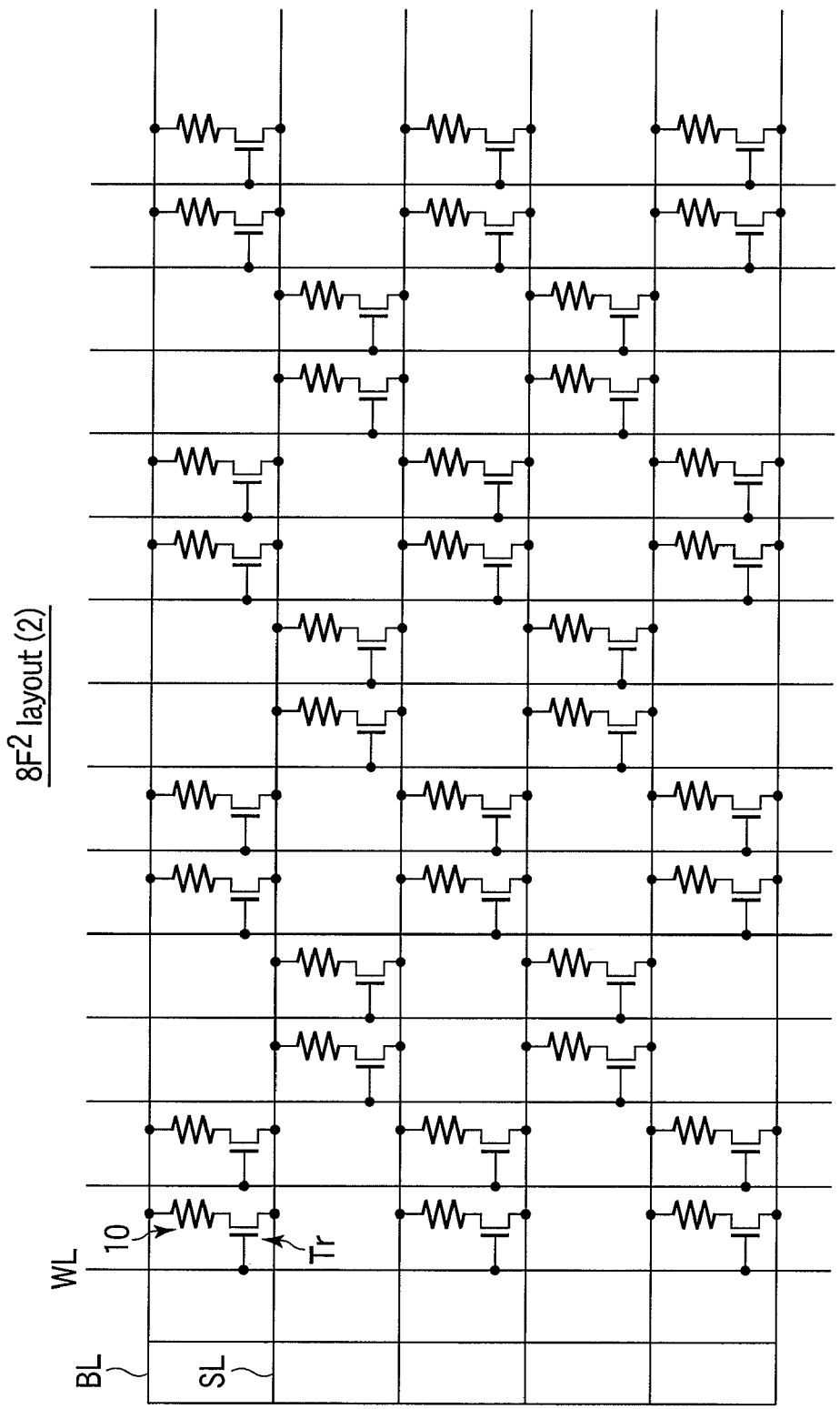
FIG. 21 is a circuit diagram showing an $8F^2$ layout (2) according to the fifth embodiment.

In an 8F² layout (2) shown in FIG. 21, the layout of the following cases will be described below. One is the case (FIG. 22) where stitch contacts C1 and C2 are arranged on both sides of a memory cell array. The other is the case (FIG. 23) where stitch contacts C1 and C2 are arranged on one side of a memory cell array.

Figure 22:
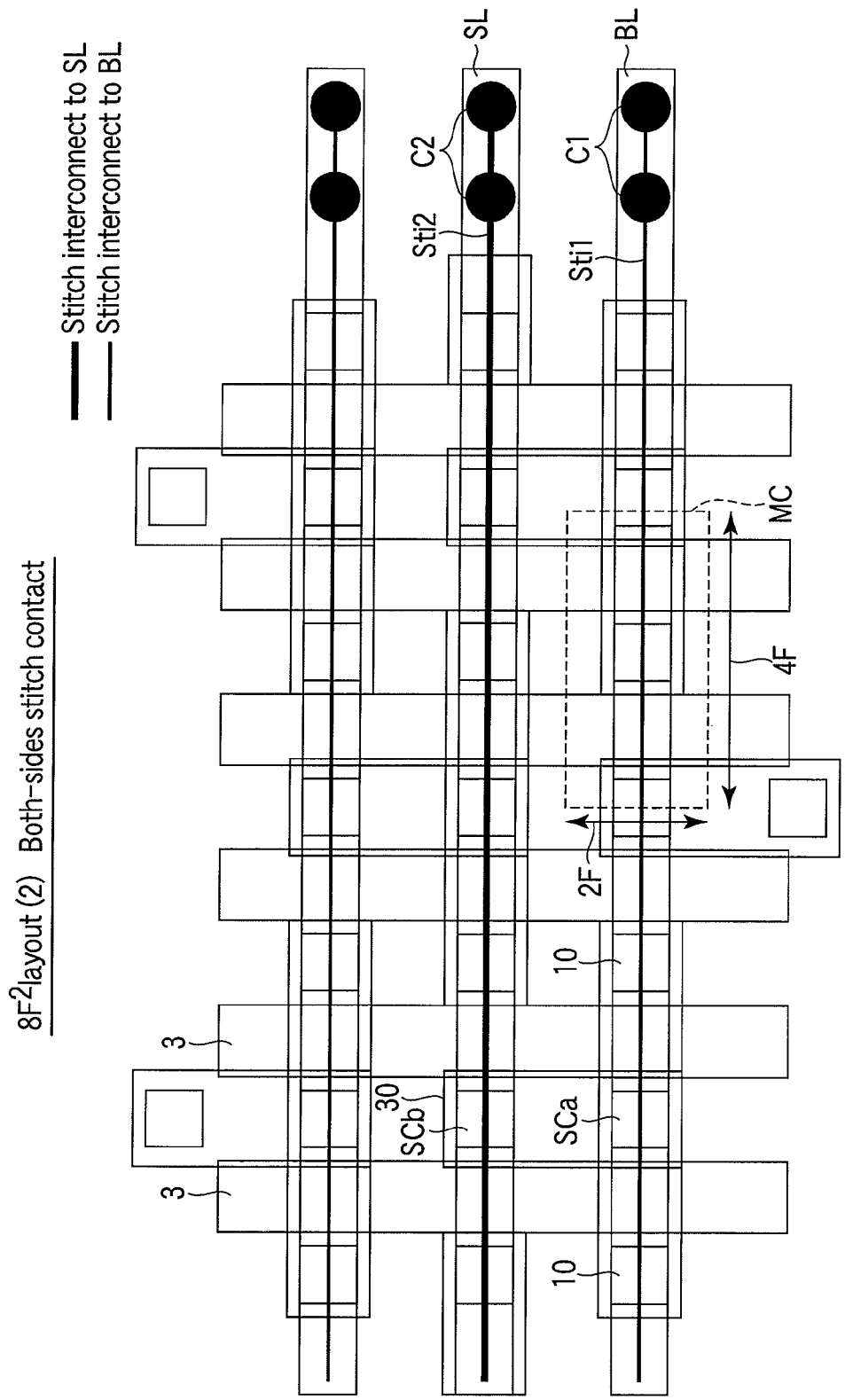
FIG. 22 is schematic view showing a both-sides stitch contact in a $8F^2$ layout (2) according to the fifth embodiment.
Figure 23:
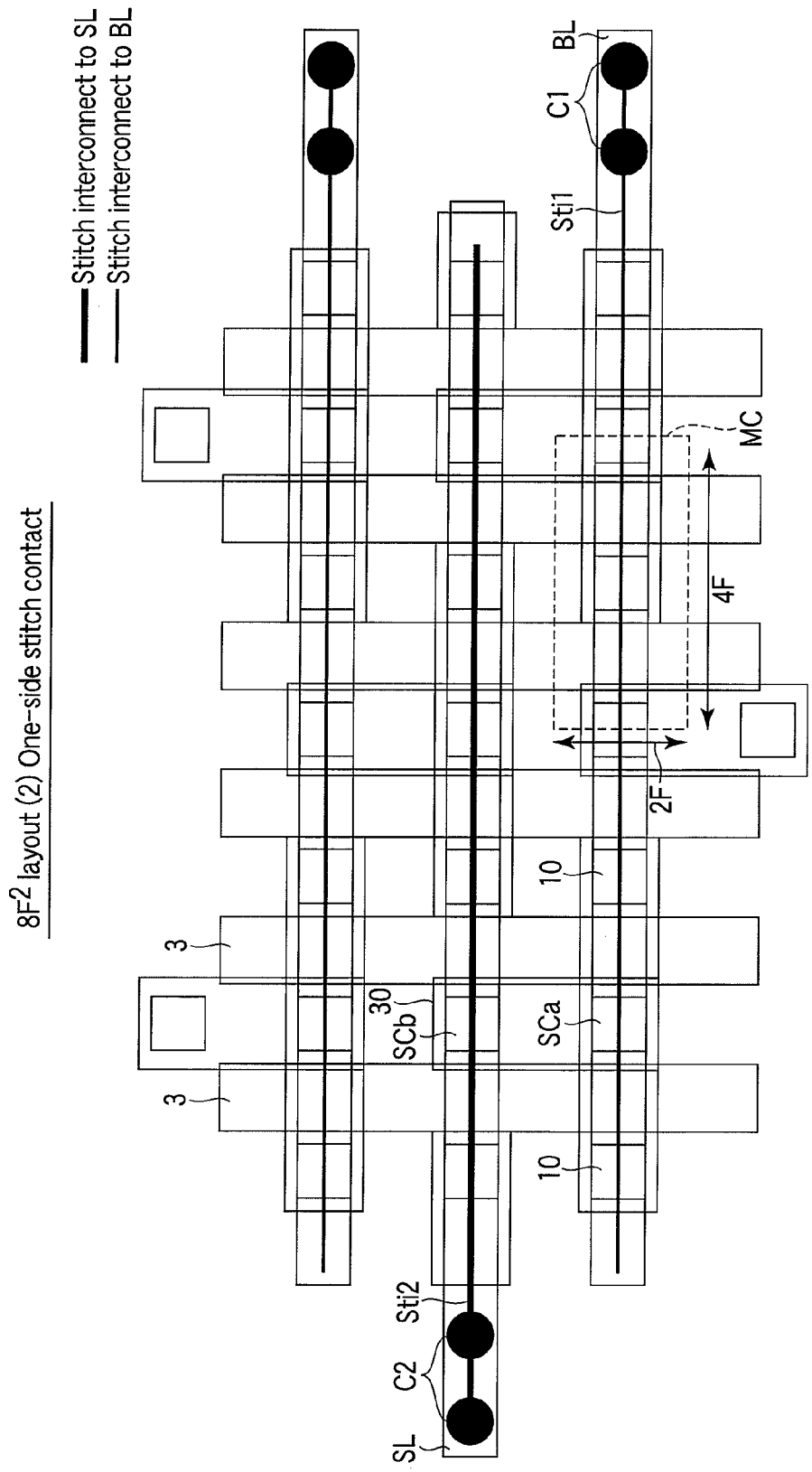
FIG. 23 is schematic view showing a one-sides stitch contact in a $8F^2$ layout (2) according to the fifth embodiment.

As shown in FIGS. 22 and 23, according to the 8F² layout (2), one terminal of an MTJ element 10 is connected to a source line SL via a source/drain diffusion layer of a transistor, a source contact SCa, an extended interconnect 30 and a source contact SCb. In this case, the source contact SCa and extended interconnect 30 are formed on a semiconductor substrate at the same level.

According to the case where stitch contacts C1 and C2 are arranged on both sides of a memory cell array, stitch contacts C1 and C2 are arranged on one edge of the memory cell array, as can be seen from FIG. 22.

According to the case where stitch contacts C1 and C2 are arranged on one side of a memory cell array, stitch contact C1 is arranged on one edge of the memory cell array while stitch contact C2 is arranged on the other edge thereof, as can be seen from FIG. 23.

[5-6] Effect

According to the fifth embodiment, stitch interconnects Sti1 and Sti2 connected to bit line BL and source line SL via contacts C1 and C2 located at a wide space are used. Thus, it is possible to reduce a pulse signal loss resulting from substrate capacitance and gate capacitance.

In addition, the space of stitch contacts C1 and C2 increases, and thereby, this serves to improve processing properties.

[6] Sixth Embodiment

According to the foregoing embodiments, bit line and source line are extended to the same direction (parallel). Conversely, according to the sixth embodiment, the source line does not extend in the same direction as the bit line, but extends in the same direction as a word line.

As shown in FIG. 24, a source line SL extends in the same direction as a word line WL, and further, a stitch interconnect Sti2 connected to the source line SL via a stitch contact C2 extends in the same direction as the word line WL.

As shown in FIG. 25, a bit line BL, the source line SL and stitch interconnects Sti1, Sti2 are arranged at different levels. Specifically, the bit line BL is arranged at an M1 level, the source line SL is arranged at an M2 level, stitch interconnect Sti1 is arranged at an M3 level, and stitch interconnect Sti2 is arranged at an M4 level.

In this case, the source line SL and stitch interconnect Sti2 are set to common potential, and thereby, a low-resistance interconnect is usable as the stitch interconnect. In addition, the resistance of the source line SL is reduced; therefore, it is possible to realize a two-time array size.

[7] Seventh Embodiment

According to the seventh embodiment, a scalable architecture is employed as a method of reducing the capacitance of a bit line and a source line.

Figure 26:
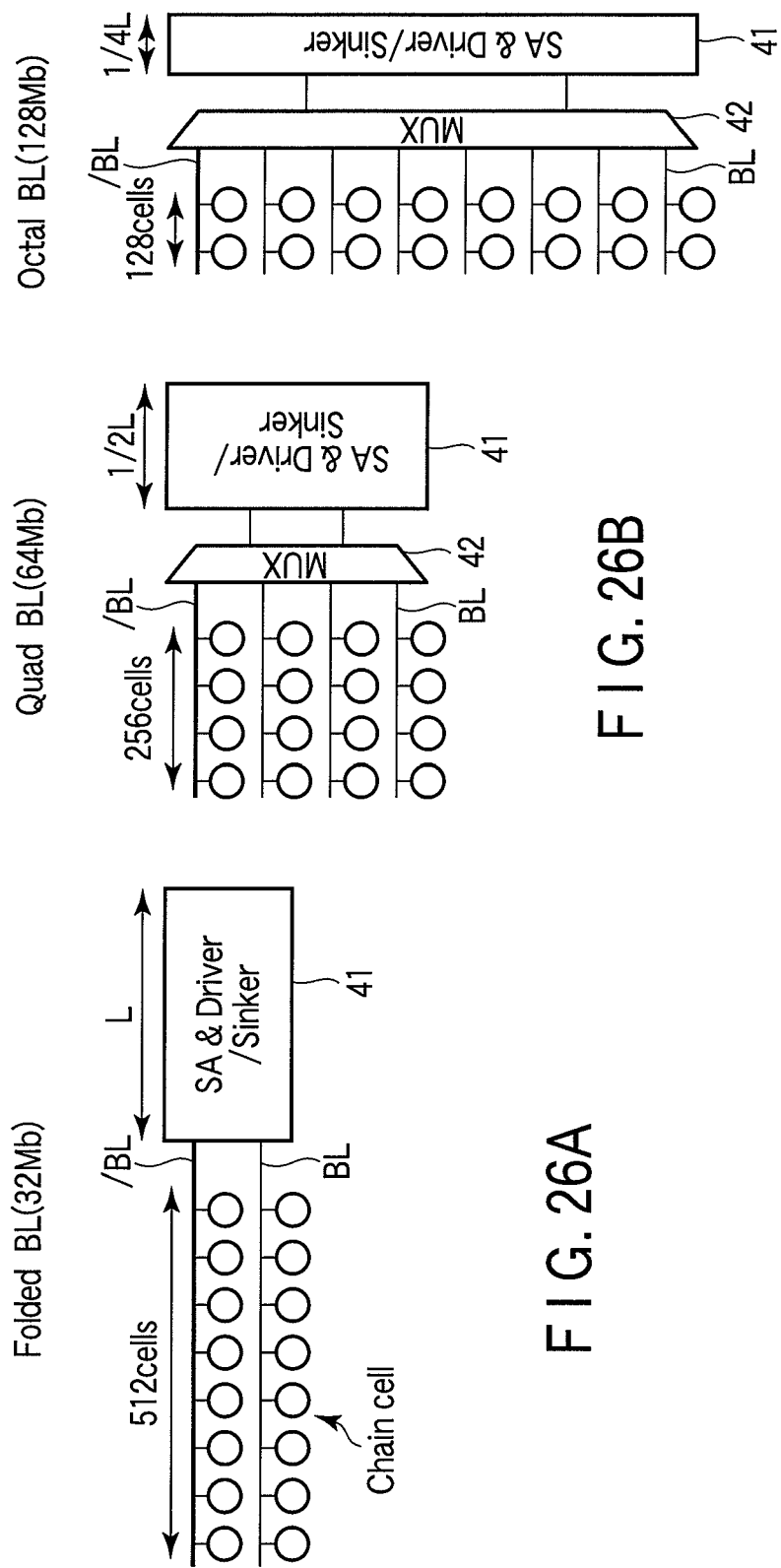
FIGS. 26A, 26B and 26C are schematic views showing an MRAM including a multiplexer according to a seventh embodiment of the present invention.

As shown in FIGS. 26A, 26B and 26C, if the number of bits is increased to 32 Mb (Folded BL), 64 Mb (Quad BL) and 128 Mb (Octal BL), the number of cells connected to a sense amplifier (SA) & driver/sinker 41 is increased. The driver/sinker 41 includes the pulse generation circuit shown in FIGS. 3 and 7. In such a case, a multiplexer (MUX) 42 is interposed between the sense amplifier (SA) & driver/sinker 41 and bit lines BL, /BL. In this way, the number of bit lines BL is increased to reduce the number of cells connected to each bit line. Therefore, it is possible to reduce the capacitance of bit lines without increasing the area ratio of a memory cell array. In this case, the multiplexer 42 is provided with respect to the source line SL, and thereby, the same effect as above is obtained.

[8] Eighth Embodiment

According to the eighth embodiment, an elevated source/drain structure is employed. Specifically, as shown in FIG. 27, an elevated source/drain diffusion layer $4a'$, $4b'$ is formed having an upper surface higher than the upper surface of a semiconductor substrate 1. In this way, a transistor Tr having the elevated source/drain structure is used, and thereby, it is possible to reduce the parasitic capacitance described in the fifth embodiment. As a result, characteristic loss of a pulse signal due to the capacitance can be reduced.

[9] Ninth Embodiment

According to the ninth embodiment, a salicide structure is employed. Specifically, as shown in FIG. 28, the surface of source/drain diffusion layer $4a$, $4b$ and a gate electrode 3 is formed with silicide layers $7a$, $7b$ and $7c$. The silicide layers $7a$, $7b$ and $7c$ are formed of high-melting point metal materials such as W, Ti, Ni, Co and Ta. In this way, a transistor Tr having a salicide structure is used, and thereby, it is possible to reduce the parasitic capacitance described in the fifth embodiment. As a result, characteristic loss of a pulse signal due to the capacitance can be reduced.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A spin-transfer magnetic memory comprising:
   a magnetoresistive element comprising a pinned layer, a free layer and a tunnel insulating layer between the pinned layer and the free layer;
   a bit line connected to a first terminal of the magnetoresistive element;
   a select transistor comprising a current path comprising a first end connected to a second terminal of the magnetoresistive element;
   a source line connected to a second end of the current path of the select transistor; and
   a pulse generator configured to generate a microwave pulse current configured to directly flow through the magnetoresistive element using the bit line and the source line, and to assist a magnetization switching of the free layer in a write operation.

2. The memory of claim 1, wherein a frequency f of the pulse current satisfies the following equation, $$\omega = 2\pi f = \gamma(-4\pi Meff),$$

$$Meff = 4\pi Ms - 2Ku/Ms$$

where Ms is saturation magnetization of the free layer, Ku is a magnetic anisotropy energy density of the free layer and γ is a gyromagnetic ratio.

3. The memory of claim 1, wherein the pulse current is a direct current, configured to flow by a predetermined time at predetermined intervals.

4. The memory of claim 3, wherein the pulse generator is configured to generate a first direction pulse current configured to flow through the magnetoresistive element while writing first data to the magnetoresistive element, and to generate a second direction pulse current configured to flow through the magnetoresistive element while writing second data to the magnetoresistive element.

5. The memory of claim 4, wherein the pulse generator comprises:
   a first P-type transistor comprising a current path comprising a first end connected to the bit line and a second end connected to a power supply terminal;
   a first N-type transistor comprising a current path comprising a first end connected to the bit line and a second end connected to a power supply terminal;
   a second P-type transistor comprising a current path comprising a first end connected to the source line and a second end connected to a power supply terminal; and
   a second N-type transistor comprising a current path comprising a first end connected to the source line and a second end connected to a power supply terminal.

6. The memory of claim 5, wherein
   the first N-type transistor and the second P-type transistor are set to an off state, and either one of the first P-type transistor and the second N-type transistor is set to an on state while one of the second N-type transistor and the first P-type transistor is alternately switched between on and off states respectively, when the first data is written to the magnetoresistive element, and
   the first P-type transistor and the second N-type transistor are set to an off state, and one of the first N-type transistor and the second P-type transistor is set to an on state while one of the second P-type transistor and the first N-type transistor and is alternately switched between on and off states respectively, when the second data is written to the magnetoresistive element.

7. The memory of claim 1, wherein the pulse current is a current of the sum of a direct current and a pulse.

8. The memory of claim 7, wherein the pulse generator is configured to generate a first direction pulse current configured to flow through the magnetoresistive element while writing first data to the magnetoresistive element, and to generate a second direction pulse current configured to flow through the magnetoresistive element while writing second data to the magnetoresistive element.

9. The memory of claim 8, wherein the pulse generator comprises:
   a first P-type transistor comprising a current path comprising a first end connected to the bit line and a second end connected to a power supply terminal;
   a first N-type transistor comprising a current path comprising a first end connected to the bit line and a second end connected to a power supply terminal;
   a second P-type transistor comprising a current path comprising a first end connected to the source line and a second end connected to a power supply terminal comprising a first potential;
   a second N-type transistor comprising a current path comprising a first end connected to the source line and a second end connected to a power supply terminal comprising the first potential;
   a third P-type transistor comprising a current path comprising a first end connected to the source line and a second end connected to a power supply terminal comprise a second potential; and
   a third N-type transistor comprising a current path comprising a first end connected to the source line and a second end connected to a power supply terminal comprising the second potential.

10. The memory of claim 9, wherein the pulse generator is configured to generate a pulse current switching between the first and second potentials.

11. The memory of claim 9, wherein
    the first N-type transistor, the second P-type transistor and the third P-type transistor are set to an off state, the first P-type transistor is set to an on state, and the second N-type transistor and the third N-type transistor are alternately switched between on and off states and set to complementary states when the first data is written to the magnetoresistive element, and
    the first P-type transistor, the second N-type transistor and the third N-type transistor are set to an off state, the first N-type transistor is set to an on state, and the second P-type transistor and the third P-type transistor alternately switched between on and off states and are set to complementary states when the second data is written to the magnetoresistive element.

12. The memory of claim 1, wherein the pulse generator is configured to generate a direct current larger than a pulse width of the pulse current configured to flow through the magnetoresistive element after the pulse current.

13. The memory of claim 1, further comprising:
    a first stitch interconnect extending in parallel with the bit line, and connected to the bit line via a first contact; and
    a second stitch interconnect extending in parallel with the source line, and connected to the source line via a second contact.

14. The memory of claim 13, wherein the source line is extending in the same direction as the bit line.

15. The memory of claim 13, wherein the source line is extending in a direction crossing the bit line.

16. The memory of claim 1, further comprising:
a plurality of bit lines;
a plurality of magnetoresistive elements connected to the bit lines; and
a multiplexer connected between the bit lines and the pulse generator.

17. The memory of claim 1, wherein the select transistor comprises a self-aligned silicide (salicide) structure.

18. The memory of claim 1, wherein the select transistor comprises an elevated source/drain structure.

* * * * *